United States Patent
Hsu et al.

(10) Patent No.: US 8,755,645 B2
(45) Date of Patent: Jun. 17, 2014

(54) CIRCULAR PHOTONIC CRYSTAL STRUCTURE, LIGHT EMITTING DIODE DEVICE AND PHOTOELECTRIC CONVERSION DEVICE

(75) Inventors: Chia-Chen Hsu, Chiayi County (TW); Jian-Hung Lin, Chiayi County (TW); Tien-Li Chang, Kaohsiung (TW); Hung-Yi Lin, Hsinchu (TW); Ta-Hsin Chou, Hsinchu (TW); Jen-Hui Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 235 days.

(21) Appl. No.: 13/150,275

(22) Filed: Jun. 1, 2011

(65) Prior Publication Data

US 2012/0251035 A1      Oct. 4, 2012

(30) Foreign Application Priority Data

Mar. 28, 2011 (TW) .............................. 100110580 A

(51) Int. Cl.
*G02B 6/122* (2006.01)

(52) U.S. Cl.
USPC ........................................... 385/14; 385/147

(58) Field of Classification Search
None
See application file for complete search history.

(56) References Cited

U.S. PATENT DOCUMENTS

| | | | |
|---|---|---|---|
| 7,113,319 B2* | 9/2006 | Segawa et al. | 359/245 |
| 7,582,910 B2* | 9/2009 | David et al. | 257/86 |
| 7,652,295 B2* | 1/2010 | Cho et al. | 257/79 |
| 2003/0053790 A1 | 3/2003 | Segawa et al. | |
| 2006/0163606 A1 | 7/2006 | Wierer et al. | |
| 2007/0257269 A1 | 11/2007 | Cho et al. | |

FOREIGN PATENT DOCUMENTS

| | | |
|---|---|---|
| CN | 101071840 | 11/2007 |
| CN | 101587927 | 11/2009 |
| TW | 200917526 | 4/2009 |
| TW | 200937687 | 9/2009 |
| TW | 201006004 | 2/2010 |

OTHER PUBLICATIONS

Kim et al., "Enhanced light extraction from GaN-based light-emitting diodes with holographically generated two-dimensional photonic crystal patterns", Applied Physics Letters 87, Nov. 10, 2005, 203508-1-203508-3.
Choi et al., "FDTD Simulation for Light Extraction in a GaN-Based LED", Journal of the Korean Physical Society, vol. 49, No. 3, Sep. 2006, pp. 877-880.
Cho et al., "Light extraction enhancement from nano-imprinted photonic crystal GaN-based blue light-emitting diodes", Optics Express 8654, vol. 14, No. 19, Sep. 18, 2006, 8654-8660.
Chang et al., "Nitride-based light emitting diodes with indium tin oxide electrode patterned by imprint lithography", Applied Physics Letters 91, Jul. 3, 2007, 013504-1-013504-3.

(Continued)

*Primary Examiner* — Sarah Hahm
(74) *Attorney, Agent, or Firm* — Jianq Chyun IP Office

(57) ABSTRACT

A method applying a circular photonic crystal structure to improve optical properties of a photoelectric conversion device such as a light emitting diode device, an organic light emitting diode device or a solar cell is provided, wherein the circular photonic crystal structure is configured on a junction surface between two different mediums where passes a light emitted or received by the photoelectric conversion device. The circular photonic crystal structure provides isotropic photonic band gap which conduces high light extraction efficiency.

22 Claims, 3 Drawing Sheets

(56) References Cited

OTHER PUBLICATIONS

Kim et al., "Fabrication of photonic crystal structures on light emitting diodes by nanoimprint lithography", Nanotechnology 18, Jan. 9, 2007, 055306-1-055306-5.

Zhang et al., "Enhancement of LED light extraction via diffraction of hexagonal lattice fabricated in ITO layer with holographic lithography and wet etching", Physics Letters A, Feb. 14, 2008, pp. 3738-3740.

Cheng et al., "Enhanced light extraction of InGaN-based green LEDs by nano-imprinted 2D photonic crystal pattern", Semicond. Sci. Technol. 23, Mar. 26, 2008, 055002-1-055002-5.

McGroddy et al., "Directional emission control and increased light extraction in GaN photonic crystal light emitting diodes", Applied Physics Letters 93, Sep. 8, 2008, 103502-1-103502-3.

Truong et al., "Light extraction from GaN-based light emitting diode structures with a noninvasive two-dimensional photonic crystal", Applied Physics Letters 94, Jan. 12, 2009, 023101-1-023101-3.

Byeon et al., "Enhancement of the photon extraction of green and blue LEDs by patterning the indium tin oxide top layer", Semicond. Sci. Technol. 24, Sep. 2, 2009, 105004-1-105004-5.

Zhang et al., "Effects of symmetry of GaN-based two-dimensional photonic crystal with quasicrystal lattices on enhancement of surface light extraction", Applied Physics Letters 88, Apr. 24, 2006, 171103-1-171103-3.

David et al., "GaN light-emitting diodes with Archimedean lattice photonic crystals", Applied Physics Letters 88, Feb. 16, 2006, 073510-1-073510-3.

Chiu et al., "High Efficiency White LEDs with 2D Photonic Quasi-Crystal and Patterned Sapphire Substrate", CLEO conference paper, Issue Date: May 4-9, 2008, pp. 1-2.

Huang et al., "Enhanced light output power of GaN-based vertical-injection light-emitting diodes with a 12-fold photonic quasi-crystal by nano-imprint lithography", Semicond. Sci. Technol. 24, Jul. 3, 2009, 085008-1-085008-5.

"Office Action of Taiwan Counterpart Application", issued on Apr. 8, 2014, p. 1-p. 12, in which the listed references were cited.

"Office Action of China Counterpart Application", issued on Apr. 2, 2014, p. 1-p. 10, in which the listed references were cited.

* cited by examiner

CIRCULAR PHOTONIC CRYSTAL STRUCTURE, LIGHT EMITTING DIODE DEVICE AND PHOTOELECTRIC CONVERSION DEVICE

CROSS-REFERENCE TO RELATED APPLICATION

This application claims the priority benefit of Taiwan application serial no. 100110580, filed Mar. 28, 2011. The entirety of the above-mentioned patent application is hereby incorporated by reference herein and made a part of this specification.

BACKGROUND

1. Technical Field

The present application is related to a photoelectric conversion device having a circular photonic crystal structure.

2. Description of Related Art

Being advantaged in long life duration, superior color saturation, high response speed and stability etc., light emitting diodes (LEDs) are broadly used in the mainstream of new generation of illumination apparatus, such as traffic lights, backlight modules of liquid crystal displays, or high power output illumination apparatus.

A light emitting efficiency of a light emitting diode depends on the external quantum efficiency thereof, while the external quantum efficiency of the light emitting diode is related to its light extraction efficiency. However, an ordinary light emitting diode device suffers from total reflection between itself and an external medium, wherein a considerable quantity of light is restricted within the light emitting diode device and thereby the light extraction efficiency is lowered.

Similarly, efficiency of other types of photoelectric conversion device such as organic light emitting diodes or solar cells is also limited for the same reason as mentioned above.

SUMMARY

A circular photonic crystal structure is applied in the present application to improve light extraction efficiency of a photoelectric conversion device. In addition, uniformity of light output of a light emitting device can be improved by applying the circular photonic crystal structure.

A circular photonic crystal structure adapted to be configured on a junction surface between two different mediums where passes a light emitted or received by a photoelectric conversion device is provided. The circular photonic crystal structure comprises a first opening and a plurality of second openings, wherein the first opening is located in a center of the circular photonic crystal structure and encircled by a plurality of concentric circles comprises the second openings.

In an embodiment, coordinates of a center of the first opening or each of the second openings in x-y plane can be determined by the following equations:

$$x = d \cdot N \cdot \sin\left(\frac{2m\pi}{a \cdot N} + b\right);$$

and $$y = d \cdot N \cdot \cos\left(\frac{2m\pi}{a \cdot N} + b\right),$$

wherein, N is an ordinal number of the concentric circle, d is a distance between two adjacent concentric circles, a is a cardinal number of the quantity of the openings on the concentric circle, m is a integral series between 1 and a·N, and b is an initial phase.

A photoelectric conversion device applying the aforementioned circular photonic crystal structure is provided. The photoelectric conversion device comprises a photoelectric conversion part, a first medium and the circular photonic crystal structure. The photoelectric conversion part is suitable for emitting or receiving a light. The first medium is located in a periphery of the photoelectric conversion part. The light passes through the first medium and a second medium outside the first medium, and the first medium and the second medium have different refractive indices. The circular photonic crystal structure is configured on a junction surface between the first medium and the second medium to improve light extraction efficiency of the photo electric conversion device.

A light emitting diode device applying the aforementioned circular photonic crystal structure is provided. The light emitting diode device comprises a substrate, a first-type doped semiconductor layer, a second-type doped semiconductor layer, an active region, a first electrode, a second electrode and the circular photonic crystal structure. The first-type doped semiconductor layer is disposed on the substrate. The second-type doped semiconductor layer is disposed on the first-type doped semiconductor layer. The active region is located between the first-type doped semiconductor layer and the second-type doped semiconductor layer. The first electrode is disposed on the first-type doped semiconductor layer, and then the second electrode is disposed on the top of device. Finally, the circular photonic crystal structure is fabricated on a top surface of the second-type doped semiconductor layer or between the first-type doped semiconductor layer and the substrate so as to improve light extraction efficiency of the light emitting diode device.

In order to make the aforementioned and other objects, features and advantages of the present application more comprehensible, several embodiments accompanied with figures are described in detail below.

BRIEF DESCRIPTION OF THE DRAWINGS

The embodiments disclosed herein can be more fully understood by reading the subsequent detailed description and examples with references made to the accompanying drawings, wherein.

DESCRIPTION OF EMBODIMENTS

The circular photonic crystal is a kind of photonic quasi crystal having rotational symmetric structure. The total reflection on a surface of a medium can be reduced by forming the circular photonic crystal structure thereon such that most lights can be outputted from the medium or enter the medium. Furthermore, a photonic crystal structure has a photonic band gap (PBG) and provides guided mode and leaky mode, which improve light emitting efficiency and uniformity of light output. More particularly, as compared with a conventional photonic crystal structure, the circular photonic crystal structure of the present application has higher rotational symmetry, which conduces isotropic photonic band gap and is capable of improving the light extraction efficiency or optical properties of the photoelectric conversion device.

On the other hand, the circular photonic crystal structure of the present application can be defined by equations. The rotational symmetry of the circular photonic crystal can be modulated by adjusting phase or other parameters of the circular photonic crystal to further enhance the light extraction efficiency of the photoelectric conversion device.

Figure 1:
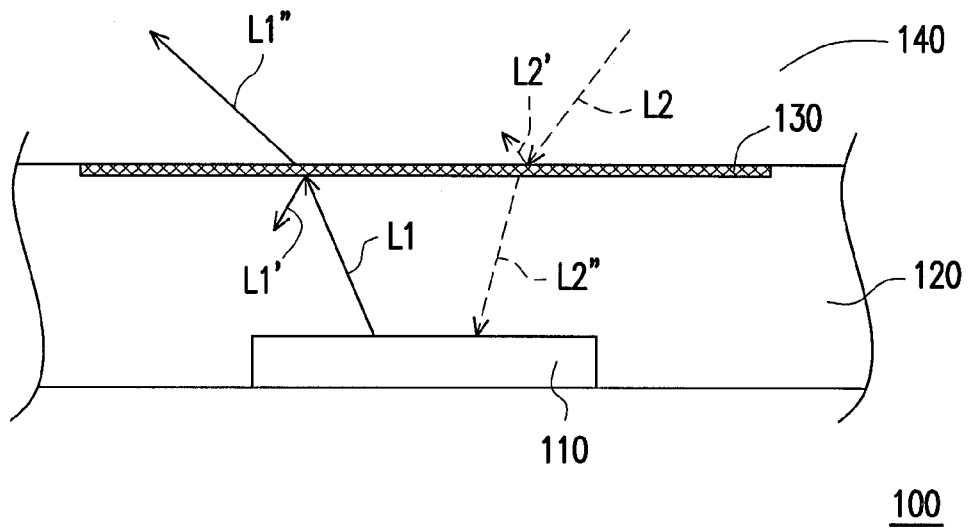
FIG. 1 is a schematic cross-sectional view of a photoelectric conversion device according to an embodiment of the present application.

FIG. 1 is a schematic cross-sectional view of a photoelectric conversion device according to an embodiment of the present application. As shown in FIG. 1, the photoelectric conversion device 100 comprises a photoelectric conversion part 110, a first medium 120 and the circular photonic crystal structure 120. The photoelectric conversion part 110 is suitable for emitting or receiving a light. More specifically, the photoelectric conversion part 110 may be a light emitting diode or an organic electro-luminescent device, for emitting a light L1. Otherwise, the photoelectric conversion part 110 may be a photo-electro device of a solar cell, for receiving an outside light L2.

The first medium 120 is located in a periphery of the photoelectric conversion part 110. The first medium 120 may be a semiconductor material, an organic material or other applicable materials with respect to the aforementioned types of the photoelectric conversion part 110. The light L1 or L2 passes through the first medium 120 and an outside second medium 140, wherein the first medium 120 and the second medium 140 have different refraction indexes, which ordinarily leads to a total reflection when the light L1 or L2 passes through a junction surface between the first medium 120 and the second medium 140. In other words, the light L1 is reflected as L1' rather than transmitted from the first medium 120 to the second medium 140, or the light L2 is reflected as L2' rather than transmitted from the second medium 140 to the first medium 120 and received by the photoelectric conversion device 110.

Hence, the present embodiment configures the circular photonic crystal structure 130 on the junction surface between the first medium 120 and the second medium 140 where the light L1 or L2 passes, so as to reduce the total reflection and allow the light L1 being transmitted from the first medium 120 to the second medium 140 as L", or being transmitted from the second medium 140 to the first medium 120 as L2" and received by the photoelectric conversion device 110. However, the position of the junction surface is not limited to the present embodiment. The aforementioned circular photonic structure can be configured on any junction surface between two different mediums on the traveling path of the light L1 or L2, to reduce the total reflection between the two different mediums and increase light output. For example, a surface of a semiconductor layer, a substrate or a molding compound of a light emitting diode device; a surface of a electron injecting layer, a hole injecting layer or a substrate of an organic light emitting diode device; or a surface of a semiconductor layer of a solar cell.

Figure 2:
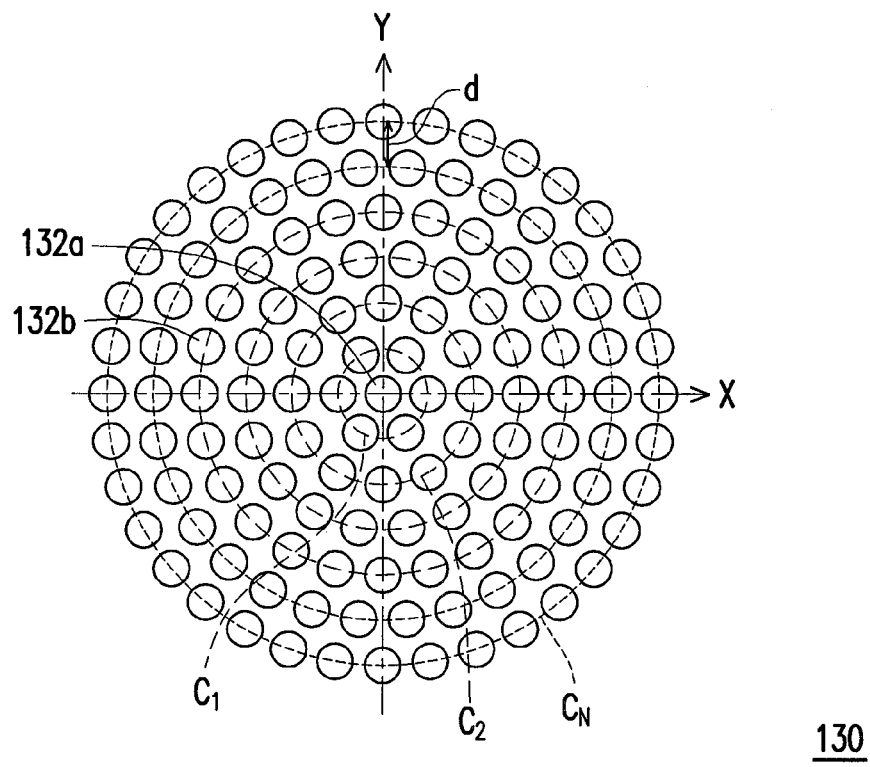
FIG. 2 is a top view of a circular photonic crystal structure of the photoelectric conversion device of FIG. 1.

FIG. 2 is a top view of a circular photonic crystal structure 130 of the photoelectric conversion device 100 of FIG. 1. As shown in FIG. 2, the circular photonic crystal structure 130 comprises a first opening 132a and a plurality of second openings 132b, wherein the first opening 132a is located in a center of the circular photonic crystal structure 130 and encircled by a plurality of concentric circles $C_1$ to $C_N$ comprises the second openings 132b.

The circular photonic crystal structure 130 of the present embodiment can be defined by the following equations. In other words, coordinates of centers of the first opening 132a and the second openings 132b on each of the concentric circles $C_1$ to $C_N$ can be determined by the following equations (1) and (2):

$$x = d \cdot N \cdot \sin\left(\frac{2m\pi}{a \cdot N} + b\right); \quad (1)$$

and $$y = d \cdot N \cdot \cos\left(\frac{2m\pi}{a \cdot N} + b\right) \quad (2)$$

wherein N is an ordinal number of the concentric circles $C_1$ to $C_N$. d is a distance between two adjacent concentric circles. a is a cardinal number of the quantity of the second openings 132b on each of the concentric circles $C_1$ to $C_N$, i.e., the quantity of the second openings 132b on the concentric circle $C_1$ is a, the quantity of the second openings 132b on the concentric circle $C_2$ is 2a, ..., the quantity of the second openings 132b on the concentric circle $C_N$ is N·a. Accordingly, the quantity of the second openings 132b gradually increases in a multiple of a according to the ordinal number of the concentric circles $C_1$ to $C_N$. m is a integral series between 1 and a·N. b is an initial phase.

More specifically, taking the circular crystal structure 130 as an example, the cardinal number a of the quantity of the second openings 132b on each of the concentric circles $C_1$ to $C_N$, is 6, i.e., the quantity of the second openings 132b on the concentric circle $C_1$ is 6, the quantity of the second openings 132b on the concentric circle $C_2$ is 12, ..., the quantity of the second openings 132b on the concentric circle $C_N$ is 6N. And, the initial phase b is 0.

However, the parameters of the above equations (1) and (2) can be adjusted among a suitable range to meet any possible requirement. For example, the initial phase b can be a constant or a random number, or can be $N \cdot \Delta\theta_N$ which gradually increase according to the ordinal number of the concentric circles $C_1$ to $C_N$. The cardinal number of the quantity of the second openings 132b on each of the concentric circles $C_1$ to $C_N$ may be ranged from 5 to 8, i.e. 5≤a≤8. The distance d between two adjacent concentric circles may be ranged from 300 nanometers to 2000 nanometers. Depth of the first opening 132a and the second openings 132b may be ranged from 50 nanometers to 300 nanometers. In addition, filling rate of the first opening 132a and the second openings 132b may be ranged from 0.2 to 0.5. The profile of the first opening 132a and the second openings 132b are not limited to be circular. In other embodiments of the present application, the profile of the first opening 132a and the second openings 132b may further be elliptic, rectangular, or other applicable profiles. The filling rate is defines as a ratio of an average radius of the first opening 132a or the second openings 132b and the distance d between two adjacent concentric circles.

As proposed in FIG. 2, the circular photonic crystal structure 130 with the initial phase b, being 0, has high rotational symmetry to improve the light extraction efficiency of the photoelectric conversion device 100. In addition, it is demonstrated that the initial phase b can be modulated in the present application to further increase the rotational symmetry of the circular photonic crystal structure 130.

Figure 3A:
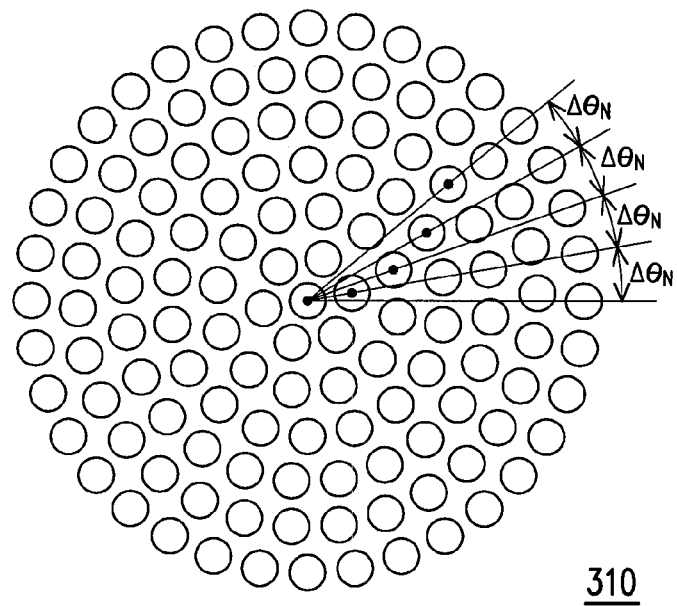
FIG. 3A and FIG. 3B illustrate two other types of circular photonic crystal structure of the present application.
Figure 3B:
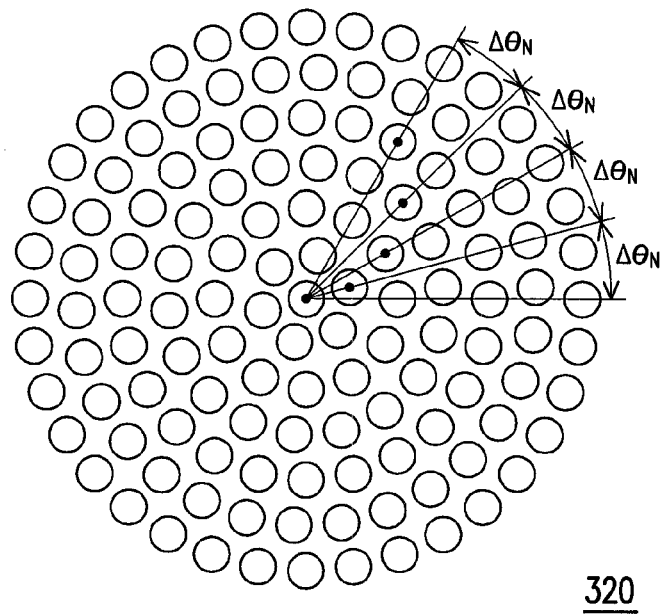

FIG. 3A and FIG. 3B illustrate two other types of circular photonic crystal structure defined by the aforementioned equations (1) and (2). The circular photonic crystal structure 310 of FIG. 3A and the circular photonic crystal structure 320 of FIG. 3B are similar to the circular photonic crystal structure 130 of FIG. 2 except that: initial phases b of the circular photonic crystal structure 310 of FIG. 3A and the circular photonic crystal structure 320 of FIG. 3B are gradually increased with the ordinal number of the concentric circles $C_1$ to $C_N$, i.e. $b = N \cdot \Delta\theta_N$, wherein $\Delta\theta_N$ of the circular photonic crystal structure 310 of FIG. 3A is 10° and $\Delta\theta_N$ of the circular photonic crystal structure 320 of FIG. 3B is 15°. Other parts of the circular photonic crystal structure 310 of FIG. 3A and the circular photonic crystal structure 320 of FIG. 3B can be referred to the circular photonic crystal structure 130 of FIG. 2 and are not repeated hereinafter.

In other embodiments of the present application, the circular photonic crystal structure may further be defined by other equations or arrangements according to practical situations and requirements of design rather than the aforementioned equations (1) and (2).

The circular photonic crystal structure can be formed by fabricating the openings directly on particular positions of the photoelectric conversion device, or by forming a circular photonic crystal pattern on a mold and then transferring the circular photonic crystal pattern from the mold to particular positions of the photoelectric conversion device by printing process such as nano-imprint. The circular photonic crystal structure or pattern may be formed by e-beam lithography, focusing ion beam, laser beam, or etching technique such as reactive ion etching.

The circular photonic crystal structure proposed by the present application has high rotational symmetry and capable of providing isotropic photonic band gap to improve the light extraction efficiency of the photoelectric conversion device. In addition, uniformity of light output of a light emitting device can further be improved by applying the circular photonic crystal structure.

A light emitting diode device is taken as an example in the following for illustrating a practical application of the circular photonic crystal structure.

Figure 4:
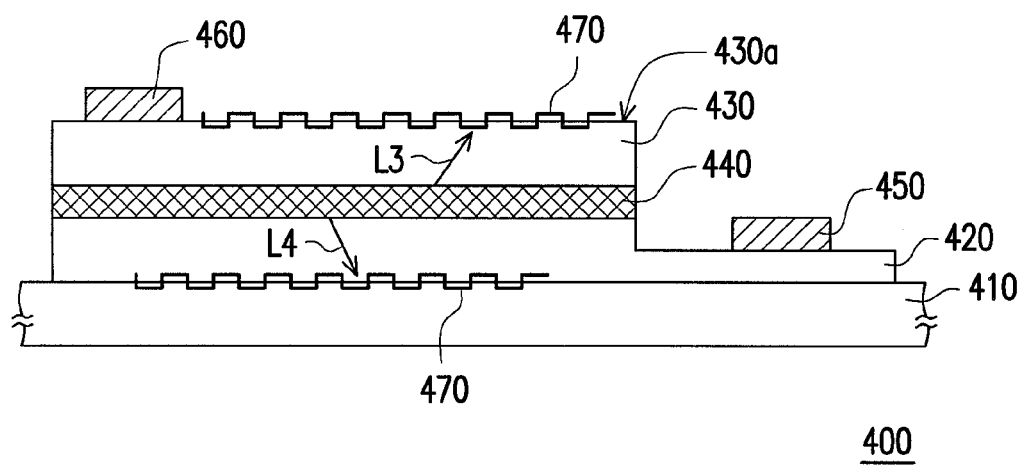
FIG. 4 illustrates a light emitting diode device applying the circular photonic crystal structure of the present application.

FIG. 4 illustrates a light emitting diode device applying the circular photonic crystal structure of the present application. As shown in FIG. 4, the light emitting diode device 400 comprises a substrate 410, a first-type doped semiconductor layer 420, a second-type doped semiconductor layer 430, an active region 440, a first electrode 450, a second electrode 460 and a circular photonic crystal structure 470. For being as an embodiment, only essential parts of the light emitting diode device 400 are shown in FIG. 4. Actually, the light emitting diode device 400 may further comprise other parts, such as a buffer layer, or a transparent conductive layer, which are not shown in FIG. 4.

The substrate 410 may be a sapphire substrate, and the first-type doped semiconductor layer 420 is disposed on the substrate 410. The first-type doped semiconductor layer 420 may be N-type doped semiconductor layer comprising N-type doped gallium nitride (GaN). The second-type doped semiconductor layer 430 is disposed on the first-type doped semiconductor layer 420. The second-type doped semiconductor layer 430 may be P-type doped semiconductor layer comprising P-type doped gallium nitride. The active region 440 is located between the first-type doped semiconductor layer 420 and the second-type doped semiconductor layer 430. The active region 440 may be a multiple quantum well (MQW) structure. The second-type doped semiconductor layer 430, the active region 440 and a part of the first-type doped semiconductor layer 420 forms a mesa structure. The first electrode 450 is disposed on the first-type doped semiconductor layer 420 exposed by the mesa structure, while the second electrode 460 is disposed on a top surface 430a of the second-type doped semiconductor layer 430.

The electrons and holes transmitted in the first-type doped semiconductor layer 420 and the second-type doped semiconductor layer 430 are combined in the multiple quantum wells of the active region 440 to emit light L3 or L4. The light L3 is the light transmitted to the top of the light emitting diode 400 (i.e. to the top surface 430a of the second-type doped semiconductor layer 430) and leaving the light emitting diode 400. The light L4 is the light transmitted to the bottom of the light emitting diode 400 (i.e. to the substrate 410).

The circular photonic crystal structure 470 may be any one of the aforementioned circular photonic crystal structure 130, 310 and 320, or other applicable circular photonic crystal structures. The circular photonic crystal structure 470 can be configured on the top surface 430a of the second-type doped semiconductor layer 430 or between the first-type dopes semiconductor layer 420 and the substrate 410, so as to modulate the traveling path of the light L3 or L4, to improve the light extraction efficiency and the uniformity of light output of the light emitting diode device 400.

The light emitting diode device 400 is merely an example for illustrating the present application. In other embodiments of the present application, the light emitting diode device may be in other profiles. Additionally, the circular photonic crystal structure can further be applied to other types of photoelectric conversion device, such as an organic light emitting diode or a solar cell. As to the above, the present application provides the circular photonic crystal structure on a junction surface between two different mediums where the light of the photoelectric conversion device passes. For example, the circular photonic crystal structure can be provided on a surface of a semiconductor layer, a substrate or a molding compound of a light emitting diode device; a surface of a electron injecting layer, a hole injecting layer or a substrate of an organic light emitting diode device; or a surface of a semiconductor layer of a solar cell. By which, the total reflection in the light of the photoelectric conversion device can be reduced to improve the light extraction efficiency and the light output effect.

Although the present application has been described with reference to the above embodiments, it will be apparent to one of the ordinary skill in the art that modifications to the described embodiment may be made without departing from the spirit of the present application. Accordingly, the scope of the present application will be defined by the attached claims not by the above detailed descriptions.

What is claimed is:

1. A photoelectric conversion device, comprising:
   a photoelectric conversion part suitable for emitting or receiving a light;
   a first medium located in a periphery of the photoelectric conversion part, wherein the light passes through the first medium and a second medium outside the first medium, and the first medium and the second medium have different refractive indices; and
   a circular photonic crystal structure disposed at a junction surface between the first medium and the second medium, wherein the circular photonic crystal structure comprises a plurality of openings, one of the openings is located at a center of the circular photonic crystal structure and encircled by a plurality of concentric circles comprises the other openings.

2. The photoelectric conversion device as claimed in claim 1, wherein coordinates of centers of the openings on one of the concentric circles are determined by the following equations:

$$x = d \cdot N \cdot \sin\left(\frac{2m\pi}{a \cdot N} + b\right);$$

and $$y = d \cdot N \cdot \cos\left(\frac{2m\pi}{a \cdot N} + b\right),$$

wherein, N is an ordinal number of the concentric circle, d is a distance between two adjacent concentric circles, a is a cardinal number of the quantity of the openings on the concentric circle, m is a integral series between 1 and a·N, and b is an initial phase.

3. The photoelectric conversion device as claimed in claim 2, wherein b=N·ΔθN.

4. The photoelectric conversion device as claimed in claim 2, wherein b is a random number.

5. The photoelectric conversion device as claimed in claim 2, wherein b is a constant.

6. The photoelectric conversion device as claimed in claim 2, wherein a is an integer, and 5≤a≤8.

7. The photoelectric conversion device as claimed in claim 1, wherein a distance between two adjacent concentric circles is between 300 nanometers and 2000 nanometers.

8. The photoelectric conversion device as claimed in claim 1, wherein a depth of each of the openings is between 50 nanometers and 300 nanometers.

9. The photoelectric conversion device as claimed in claim 1, wherein a filling rate of each of the openings is between 0.2 and 0.5.

10. The photoelectric conversion device as claimed in claim 1, wherein a profile of each of the openings comprises circular, elliptic or rectangular.

11. The photoelectric conversion device as claimed in claim 1, wherein the photoelectric conversion part comprises a light emitting diode, an organic electro-luminescent device or a photo-electro device.

12. The photoelectric conversion device as claimed in claim 1, wherein the first medium comprises semiconductor material or organic material.

13. A light emitting diode device, comprising:
a substrate;
a first-type doped semiconductor layer disposed on the substrate;
a second-type doped semiconductor layer disposed on the first-type doped semiconductor layer;
an active region located between the first-type doped semiconductor layer and the second-type doped semiconductor layer;
a first electrode disposed on the first-type doped semiconductor layer;
a second electrode disposed on the second-type doped semiconductor layer; and
a circular photonic crystal structure disposed on a top surface of the second-type doped semiconductor layer or between the first-type doped semiconductor layer and the substrate, wherein the circular photonic crystal structure comprises a plurality of openings, one of the openings is located at a center of the circular photonic crystal structure and encircled by a plurality of concentric circles comprises the other openings.

14. The light emitting diode as claimed in claim 13, wherein coordinates of a center of each of the openings is determined by the following equations:

$$x = d \cdot N \cdot \sin\left(\frac{2m\pi}{a \cdot N} + b\right);$$

and $$y = d \cdot N \cdot \cos\left(\frac{2m\pi}{a \cdot N} + b\right),$$

wherein, N is an ordinal number of the concentric circle, d is a distance between two adjacent concentric circles, a is a cardinal number of the quantity of the openings on the concentric circle, in is a integral series between 1 and a·N, and b is an initial phase.

15. The light emitting diode device as claimed in claim 14, wherein b=N·Δθn.

16. The light emitting diode device as claimed in claim 14, wherein b is a random number.

17. The light emitting diode device as claimed in claim 14, wherein b is a constant.

18. The light emitting diode device as claimed in claim 14, wherein a is an integer, and 5≤a≤8.

19. The light emitting diode device as claimed in claim 13, wherein a distance between two adjacent concentric circles is between 300 nanometers and 2000 nanometers.

20. The light emitting diode device as claimed in claim 13, wherein a depth of each of the openings is between 50 nanometers and 300 nanometers.

21. The light emitting diode device as claimed in claim 13, wherein a filling rate of each of the openings is between 0.2 and 0.5.

22. The light emitting diode device as claimed in claim 13, wherein a profile of each of the openings comprises circular, elliptic or rectangular.

* * * * *